(12) United States Patent
Kim et al.

(10) Patent No.: US 7,898,287 B2
(45) Date of Patent: Mar. 1, 2011

(54) INPUT BUFFER CAPABLE OF REDUCING DELAY SKEW

(75) Inventors: Ki Ho Kim, Seoul (KR); Kang Seol Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 104 days.

(21) Appl. No.: 12/291,731

(22) Filed: Nov. 13, 2008

(65) Prior Publication Data

US 2009/0251175 A1    Oct. 8, 2009

(30) Foreign Application Priority Data

Apr. 7, 2008    (KR) ............... 10-2008-0032271

(51) Int. Cl.
*H03K 17/16* (2006.01)
*H03K 19/003* (2006.01)

(52) U.S. Cl. .................. 326/29; 327/108; 327/170
(58) Field of Classification Search ............. 326/29, 326/83, 85, 86; 327/108, 170; 365/189.05
See application file for complete search history.

(56) References Cited

U.S. PATENT DOCUMENTS

| 6,462,589 | B2 * | 10/2002 | Taylor .................. 327/108 |
| 6,842,059 | B1 * | 1/2005 | Wu ..................... 327/199 |
| 6,937,066 | B2 * | 8/2005 | Porter et al. ........... 326/83 |
| 7,342,424 | B2 | 3/2008 | Kang et al. |
| 7,348,809 | B2 | 3/2008 | Eldredge |
| 7,602,653 | B2 * | 10/2009 | Seo et al. .......... 365/189.05 |
| 2006/0220674 | A1 * | 10/2006 | Yeung et al. .......... 326/29 |
| 2006/0250163 | A1 * | 11/2006 | Morzano ............... 327/57 |

FOREIGN PATENT DOCUMENTS

| KR | 10-1998-0012885 | 4/1998 |
| KR | 10-2005-0062750 A | 6/2005 |

\* cited by examiner

*Primary Examiner*—Rexford N Barnie
*Assistant Examiner*—Crystal L Hammond
(74) *Attorney, Agent, or Firm*—John P. White; Cooper & Dunham LLP

(57) ABSTRACT

An input buffer includes a delay compensation unit for combining (a) a first signal obtained by buffering an input signal using another signal, which is out of phase with the input signal, with (b) a second signal obtained by buffering the input signal using a reference voltage signal, to output a third signal.

25 Claims, 7 Drawing Sheets

INPUT BUFFER CAPABLE OF REDUCING DELAY SKEW

TECHNICAL FIELD

The present disclosure relates to a semiconductor memory and, more particularly, to an input buffer.

BACKGROUND

Generally, a semiconductor memory includes an input buffer for buffering an external input signal applied from an external chipset and outputting it as an internal input signal. For this input buffer, there are the following types of buffers: a single ended type buffer to perform a buffering operation using a voltage difference between an input signal and a constant reference voltage VREF; and a differential type buffer to perform a buffering operation using a voltage difference between two input signals which are out of phase with each other.

FIG. 1A is a circuit diagram illustrating a conventional differential type input buffer, and FIG. 1B is a diagram for explaining an operation of the input buffer of FIG. 1A.

As shown in FIGS. 1A and 1B, if an input signal IN becomes greater than an input signal INb (sections A and C in FIG. 1B), a node 1 becomes low and thus the conventional input buffer outputs a logic high signal. On the other hand, if the input signal INb becomes greater than the input signal IN (sections B and D in FIG. 1B), the node 1 becomes high and thus the input buffer outputs a logic low signal. However, the input buffer has a delay skew which is changed according to the change of a cross point of the input signals.

FIGS. 2A and 2B are diagrams for explaining the delay skew of the input buffer in FIG. 1A.

As illustrated in FIGS. 2A and 2B, in the conventional differential type input buffer, the delay of the buffer output BUF_OUT is changed according to the change of the cross point VIX where the input signals IN and INb meet. At a cross point +VIX where the cross point VIX becomes greater than a reference point 0, ½ VDD, since NMOS transistors within the input buffer operate in response to an input signal of high voltage level, the input buffer performs a buffering operation rapidly. By contrast, at a cross point −VIX where the cross point VIX becomes smaller, since the NMOS transistors operate in response to an input signal of low voltage level, the input buffer performs the buffering operation slowly.

As described above, the conventional differential type input buffer has a delay skew such that an operation speed of the input buffer is changed according to the change of the cross point VIX of the input signals.

BRIEF SUMMARY

In an aspect of the present disclosure, an input buffer is provided that is capable of reducing delay skew according to the change of a cross point of input signals.

In an embodiment, an input buffer includes a delay compensation unit configured to combine (a) a first signal obtained by buffering an input signal using another signal, which is out of phase with the input signal, with (b) a second signal obtained by buffering the input signal using a reference voltage signal, and output a third signal.

In another exemplary embodiment, an input buffer comprises a first buffer unit configured to output a first signal obtained by buffering an input signal using another signal, which is out of phase with the input signal, a second buffer unit configured to output a second signal obtained by buffering the input signal using a reference voltage having a constant voltage level, and a delay compensation unit configured to output a third signal by combining the first signal with the second signal.

In still another exemplary embodiment, an input buffer comprises a buffer unit configured to output a first signal having an output delay which is changed according to the change of a cross point of input signals, and a delay compensation unit configured to combine the first signal with a second signal obtained by buffering the input signal with a constant output delay and then outputting a third signal which is compensated for a delay skew of the first signal.

The input buffer of this disclosure is capable of reducing an output delay skew according to the change of the cross point of the input signals.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and exemplary embodiments of the present disclosure will be described with reference to accompanying drawings. However, the examples and embodiments are for illustrative purposes only and are not intended to limit the scope of the invention.

Figure 3:
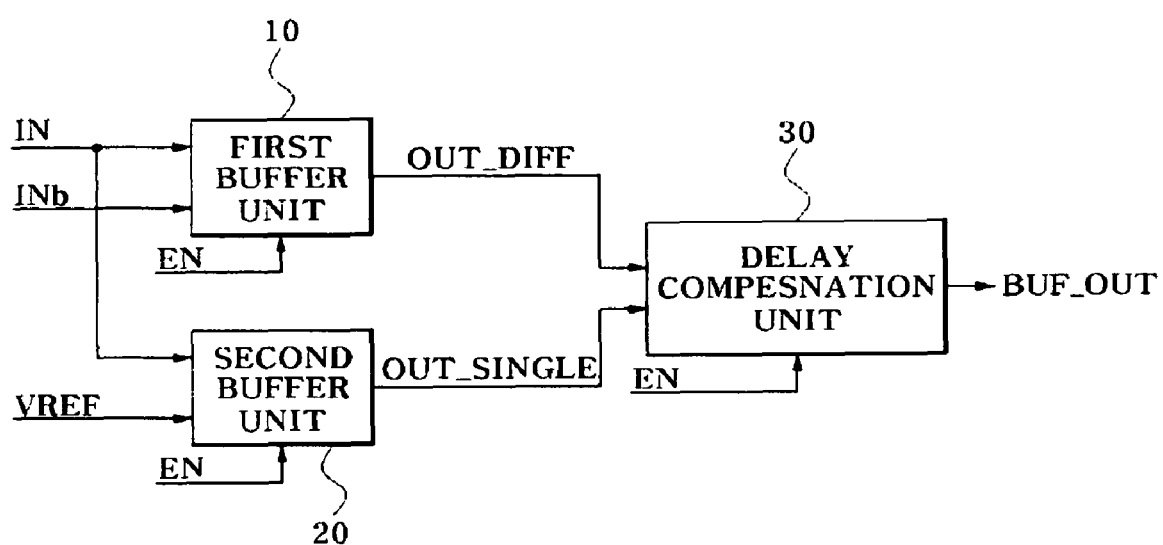
FIG. 3 is a block diagram illustrating an input buffer according to an embodiment of this disclosure.
Figure 4:
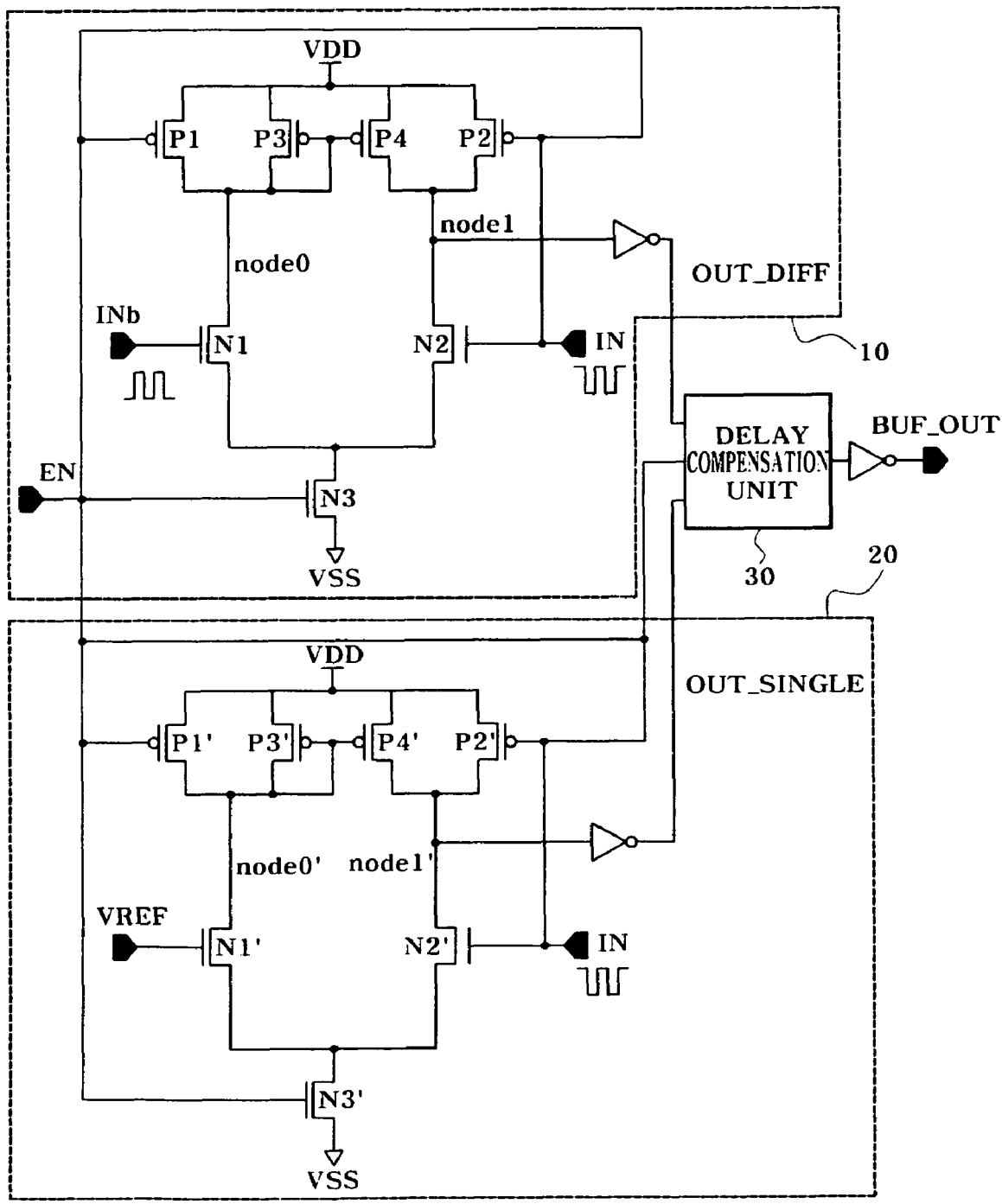
FIG. 4 is a circuit diagram illustrating an example of an input buffer according to this disclosure.

FIG. 3 is a block diagram showing an input buffer according to an embodiment of this disclosure, and FIG. 4 is a circuit diagram for an embodiment of the input buffer of FIG. 3.

As illustrated in FIGS. 3 and 4, this disclosure includes a first buffer unit 10 which outputs a first signal OUT_DIFF obtained by buffering an input signal IN using a signal INb, which is out of phase with the input signal IN, a second buffer unit 20 which outputs a second signal OUT_SINGLE obtained by buffering the input signal IN using a reference voltage VREF with a constant voltage level, and a delay compensation unit 30 which combines the first signal OUT_DIFF with the second signal OUT_SINGLE, to output a third signal BUF_OUT which is compensated for a delay skew of the first signal OUT_DIFF.

The first buffer unit 10, the second buffer unit 20 and the delay compensation unit 30 are activated in response to an identical enable signal EN.

The first buffer unit 10 is a differential type buffer to perform a buffering operation using the voltage difference between the two input signals IN and INb, which are out of phase with each other, and it has an output delay changed according to the change of the cross point VIX of the two input signals IN and INb.

The second buffer unit 20 is a single ended type buffer to perform a buffering operation using the voltage difference between the reference voltage VREF and the input signal IN, and it has a constant output delay according to a constant cross point of the two input signals VREF and IN. Here, a single ended type buffer is taken as an example for the second buffer unit 20, but other buffer units which delay and buffer an input signal by a predetermined delay section may also be used.

The delay compensation unit 30 combines (a) the first signal OUT_DIFF having an output delay which is changed according to the change of the cross point of the input signals IN and INB of the first buffer unit 10 with (b) the second signal OUT_SINGLE having a constant output delay according to a constant cross point of the input signals VREF and IN of the second buffer unit 20, and then outputs a third signal BUF_OUT with the reduction of the delay skew.

Figure 5:
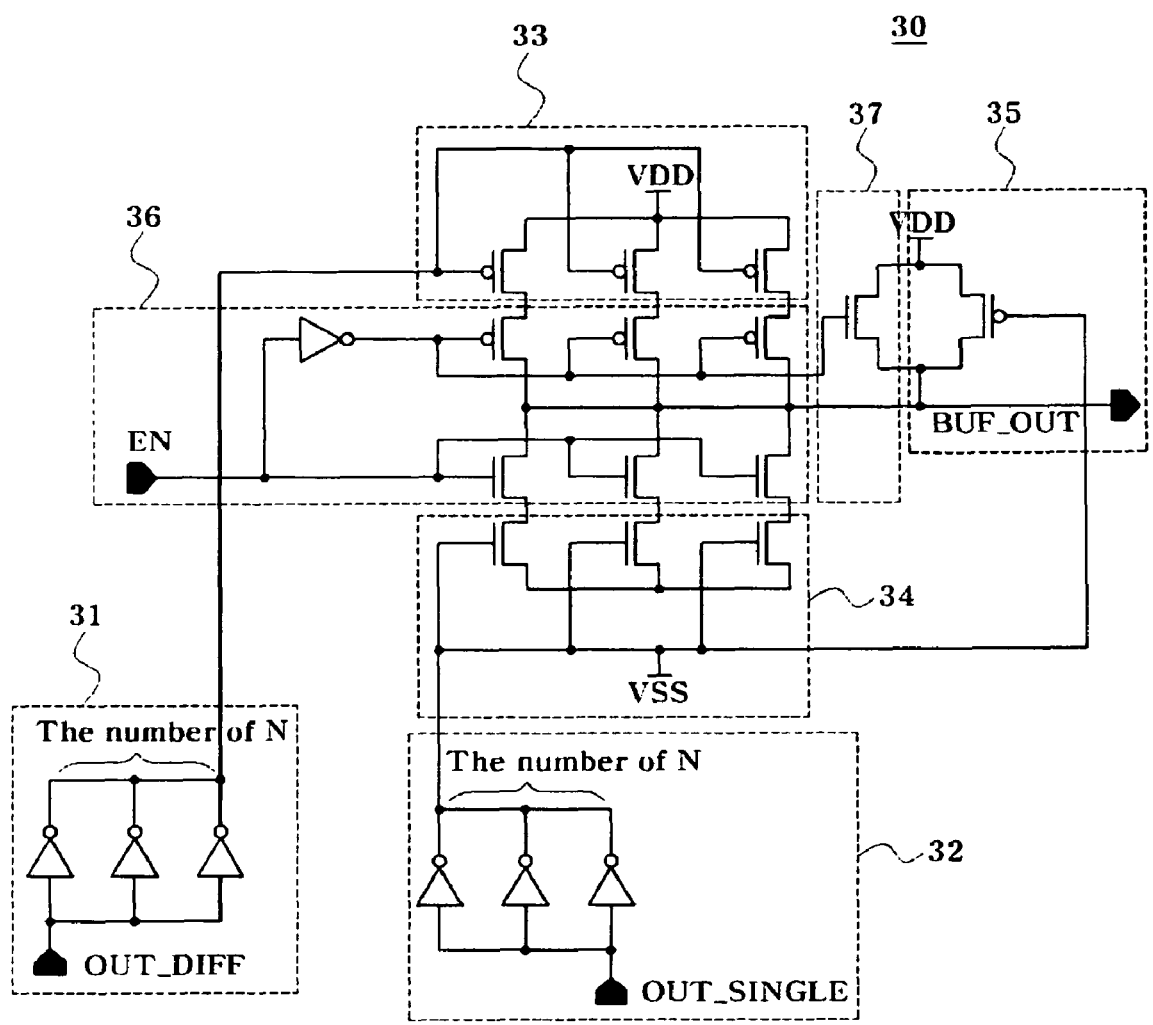
FIG. 5 is a circuit diagram illustrating an example of a delay compensation unit in the input buffer of FIG. 4.

FIG. 5 is a circuit diagram illustrating an embodiment of the delay compensation unit shown in FIG. 4.

As illustrated in FIG. 5, the delay compensation unit 30 includes a first inverter 31 for inverting the first signal OUT_DIFF, a second inverter 32 for inverting the second signal OUT_SINGLE, a first pull-up driving unit 33 for pull-up driving a node in response to an output signal of the first inverter 31, a first pull-down driving unit 34 for pull-down driving the node in response to an output signal of the second inverter 32, a second pull-up driving unit 35 for pull-up driving the node in response to the output signal of the second inverter 32.

The first inverter 31 and the second inverter 32 each includes a plurality of inverters connected in parallel to one another.

The first pull-up driving unit 33 includes a plurality of PMOS transistors connected in parallel to one another, and the first pull-down driving unit 34 includes a plurality of NMOS transistors connected in parallel to one another.

In addition, the delay compensation unit 30 further includes an enable unit 36 for enabling the first pull-up driving unit 33 and the first pull-down driving unit 34 in response to an enable signal EN, and a voltage setting unit 37 for setting the node to a constant power supply voltage VDD level in response to an inverted signal of the enable signal EN if the enable signal EN is inactivated.

FIGS. 6A to 6D are diagrams showing input/output waveforms of the input buffer according to an embodiment of this disclosure.

Figure 6A:
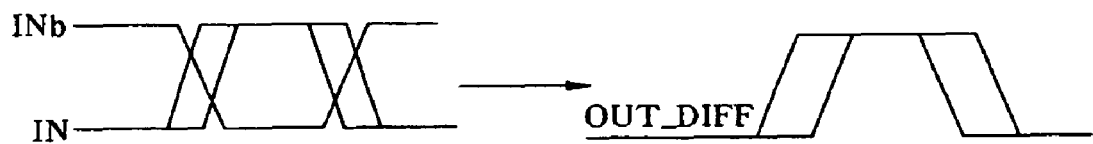
FIGS. 6A to 6D are diagrams illustrating input/output waveforms of the input buffer according to an embodiment of this disclosure.

FIG. 6A is a diagram of an input/output waveform of the first buffer unit 10 that performs the buffering operation using the voltage difference between two input signals IN and INb, which are out of phase with each other, showing the output delay that is changed according to the change of the cross point VIX of the two input signals IN and INb. A delay skew of the output signal OUT_DIFF according to the change of the cross point VIX is great.

Figure 6B:
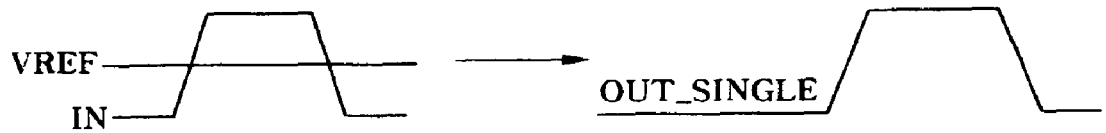

FIG. 6B is a diagram of an input/output waveform of the second buffer unit 20 that performs the buffering operation using the voltage difference between the reference voltage VREF and the input signal IN, showing a constant output delay according to a constant cross point VIX of the input signals VREF and IN.

Figure 6C:
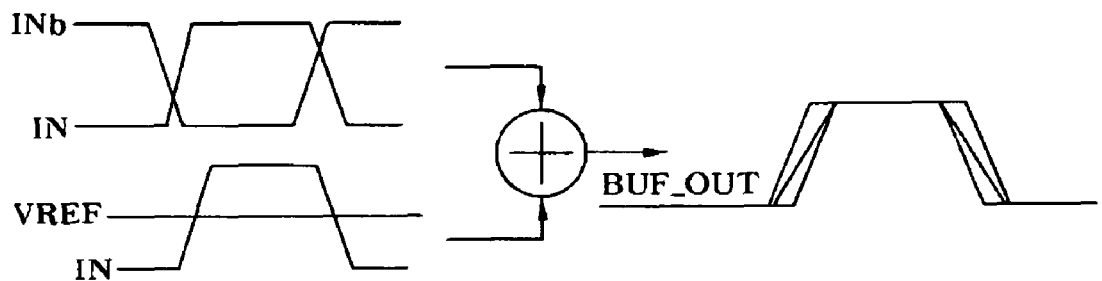
Figure 6D:
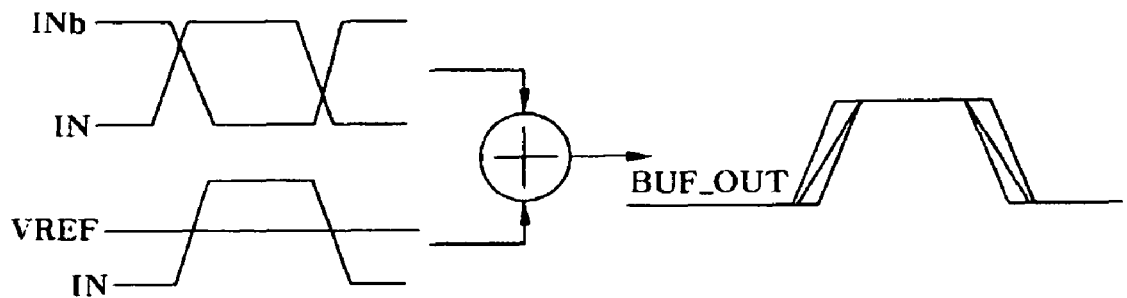

FIGS. 6C and 6D are diagrams showing input/output waveforms of an example of the delay compensation unit.

FIG. 6C shows the case when the cross point VIX of the input signals of the first buffer unit 10 is lower than ½ VDD. In this case, the output signal OUT_DIFF of the first buffer unit 10 is output more slowly than the output signal OUT_SINGLE of the second buffer unit 20. However, the final output BUF_OUT becomes a mean value of the two output signals OUT_DIFF and OUT_SINGLE, thus being delayed less.

On the contrary, FIG. 6D shows the case when the cross point VIX of the input signal of the first buffer unit 10 is lower than ½ VDD. In this case, the output signal OUT_DIFF of the first buffer unit 10 is output faster than the output signal OUT_SINGLE of the second buffer unit 20. However, the final output BUF_OUT becomes a mean value of the two outputs OUT_DIFF and OUT_SINGLE, thus being output not as fast.

Consequently, if the states of FIGS. 6C and 6D are combined, the delay skew according to the cross point VIX of the input signals of the input buffer is reduced.

Figure 7A:
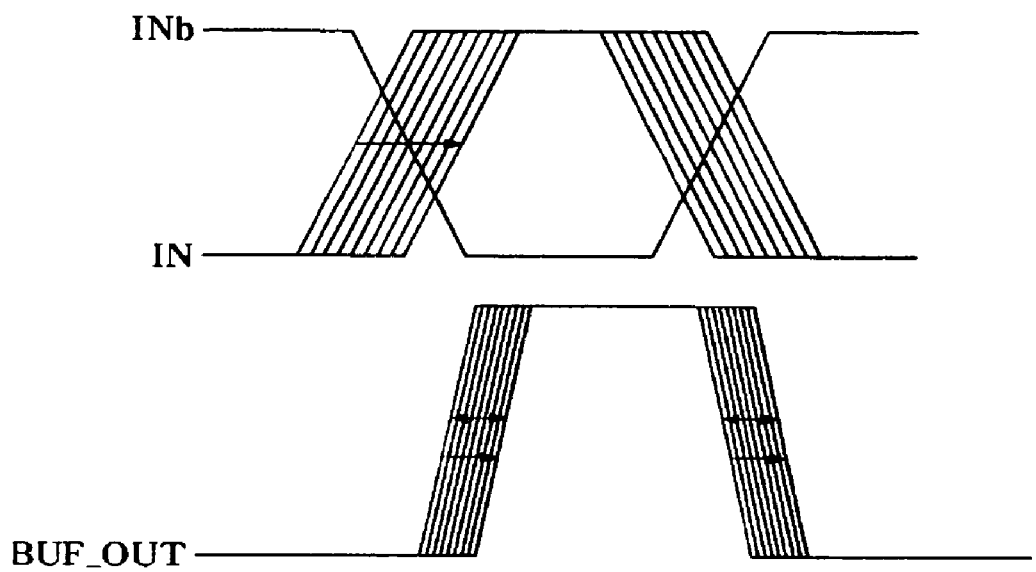
FIGS. 7A and 7B are diagrams for explaining an improved delay skew of the input buffer according to an embodiment of this disclosure.
Figure 7B:
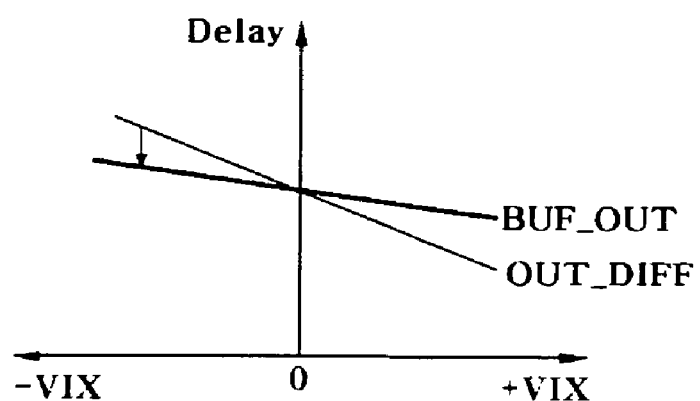

FIGS. 7A and 7B are diagrams for explaining an improved delay skew of the input buffer according to an embodiment of this disclosure.

Figure 1A:
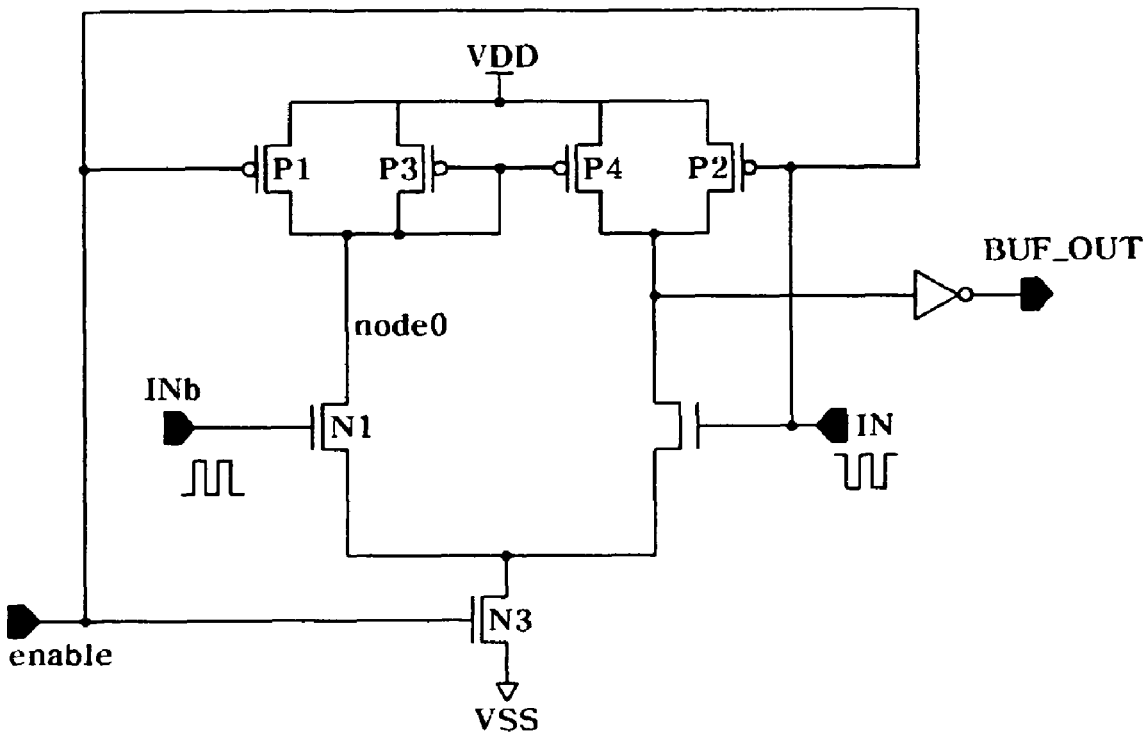
FIG. 1A is a circuit diagram showing a conventional differential type input buffer.
Figure 1B:
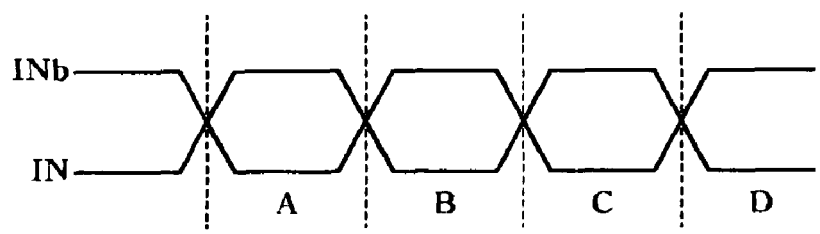
FIG. 1B is a diagram showing an operation of the conventional input buffer shown in FIG. 1A.
Figure 2A:
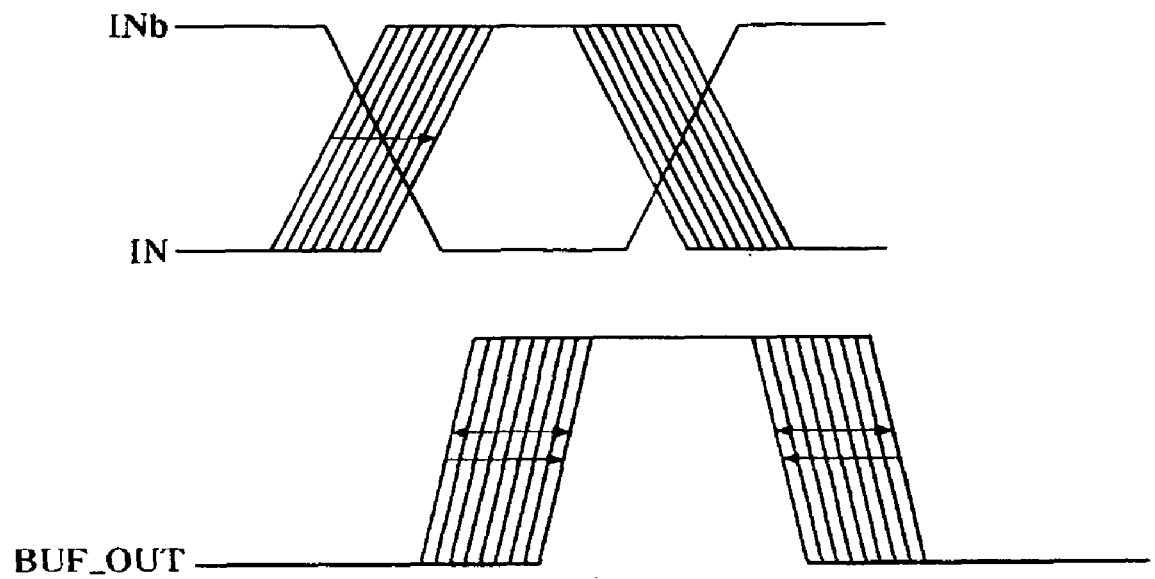
FIGS. 2A and 2B are diagrams for explaining a delay skew of the input buffer of FIG. 1A.
Figure 2B:
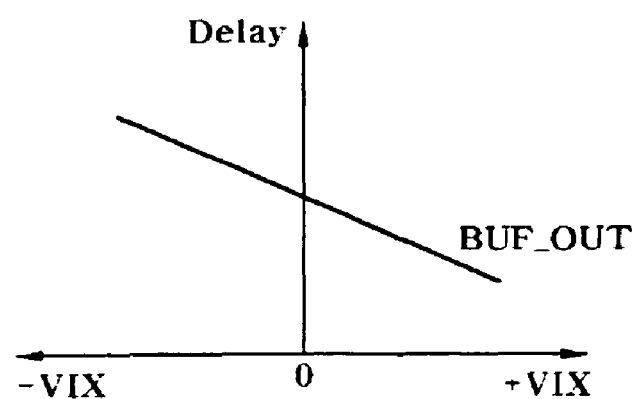

FIGS. 7A and 7B show that the delay skew is reduced as compared to the delay skew shown in FIGS. 2A and 2B. It can be checked that the slope of the graph for the output of the input buffer becomes gentle despite the change of the cross point VIX.

The subject matter of this disclosure as described above through embodiments makes a final output of the input buffer by combining the output of the differential type buffer with the output of the single ended type buffer.

The single ended type buffer which performs the buffering operation using a constant reference voltage has a constant cross point of the input signals IN and VREF as compared to the differential type buffer. Therefore, its output may be slower than that of the differential type buffer if the cross point VIX of the differential type buffer is great, whereas its output may be faster than that of the differential type buffer if the cross point VIX of the differential type buffer is small.

Therefore, since the output signal of the differential type buffer is combined with that of the single ended type buffer, if the cross point VIX of the differential type buffer is great, the rapid delay speed of the final output of an input buffer according to this disclosure may be reduced by half, whereas if the cross point VIX is small, the slow delay speed of the final output may be reduced by half.

Consequently, an input buffer according to this disclosure can reduce the output skew due to the change of the cross point of the input signal.

While the present invention has been described with respect to particular examples and exemplary embodiments, it will be apparent to those skilled in the art that various changes and modifications may be made without departing from the spirit and scope of this disclosure and the following claims.

This disclosure claims priority to Korean application number 10-2008-32271, filed on Apr. 7, 2008, the entire contents of which are incorporated herein by reference.

What is claimed is:

1. An input buffer comprising:
a delay compensation unit configured to combine a first signal obtained by buffering an input signal using another signal, which is out of phase with the input signal, with a second signal obtained by buffering the input signal using a reference voltage signal, and output a third signal,
wherein the delay compensation unit drives the third signal in response to the first signal and drives the second signal when an enable signal is activated, and outputs the third signal as a level of a power supply voltage when the enable signal is inactivated.

2. The input buffer of claim 1, wherein the first signal has an output delay which is changed according to a change of a cross point of the input signal and the another signal.

3. The input buffer of claim 1, wherein the second signal has a constant output delay according to a constant cross point of the input signal and the reference voltage signal.

4. The input buffer of claim 1, wherein the delay compensation unit combines (a) the first signal having an output delay which is changed according to a change of the cross point of the input signal and the another signal with (b) the second signal having a constant output delay according to a constant cross point of the input signal and the reference voltage signal, to output the third signal which is compensated for a delay skew of the first signal.

5. The input buffer of claim 1, wherein the delay compensation unit includes:
a first inverter configured to invert the first signal;
a second inverter configured to invert the second signal;
a first pull-up driving unit configured to pull-up drive a node in response to an output signal of the first inverter;
a first pull-down driving unit configured to pull-down drive the node in response to an output signal of the second inverter; and
a second pull-up driving unit configured to pull-up drive the node in response to the output signal of the second inverter.

6. The input buffer of claim 5, wherein each of the first and second inverters includes a plurality of inverters connected in parallel to one another.

7. The input buffer of claim 5, wherein the first pull-up driving unit includes a plurality of PMOS transistors connected in parallel to one another and wherein the first pull-down driving unit includes a plurality of NMOS transistors connected in parallel to one another.

8. The input buffer of claim 5, wherein the delay compensation unit further includes an enable unit for enabling the first pull-up driving unit and the first pull-down driving unit in response to the enable signal.

9. The input buffer of claim 5, wherein the delay compensation unit further includes a voltage setting unit for setting the node to a constant power supply voltage level in response to an inverted signal of the enable signal if the enable signal is inactivated.

10. An input buffer comprising:
a first buffer unit configured to output a first signal obtained by buffering an input signal using another signal, which is out of phase with the input signal;
a second buffer unit configured to output a second signal obtained by buffering an input signal using a reference voltage of a constant voltage level; and
a delay compensation unit configured to combine the first signal with the second signal, to output a third signal,
wherein the delay compensation unit drives the third signal in response to the first signal and drives the second signal when an enable signal is activated, and outputs the third signal as a level of a power supply voltage when the enable signal is inactivated.

11. The input buffer of claim 10, wherein the first buffer unit is a differential type buffer which performs a buffering operation using a voltage difference between the input signal and the another signal which are out of phase with each other.

12. The input buffer of claim 10, wherein the second buffer unit is a single ended type buffer which performs a buffering operation using a voltage difference between the reference voltage and the input signal.

13. The input buffer of claim 10, wherein the delay compensation unit combines (a) the first signal having an output delay which is changed according to a change of a cross point of the input signal and the another signal with (b) the second signal having a constant output delay according to a constant cross point of the input signal, and the reference voltage to output the third signal which is compensated for a delay skew of the first signal.

14. The input buffer of claim 10, wherein the first buffer unit, the second buffer unit and the delay compensation unit are activated in response to the enable signal.

15. The input buffer of claim 10, wherein the delay compensation unit includes:
a first inverter configured to invert the first signal;
a second inverter configured to invert the second signal;
a first pull-up driving unit configured to pull-up drive a node in response to an output signal of the first inverter;
a first pull-down driving unit configured to pull-down drive the node in response to an output signal of the second inverter; and
a second pull-up driving unit configured to pull-up drive the node in response to the output signal of the second inverter.

16. The input buffer of claim 15, wherein each of the first and second inverters includes a plurality of inverters connected in parallel to one another.

17. The input buffer of claim 15, wherein the first pull-up driving unit includes a plurality of PMOS transistors connected in parallel to one another and wherein the first pull-down driving unit includes a plurality of NMOS transistors connected in parallel to one another.

18. The input buffer of claim 15, wherein the delay compensation unit further includes an enable unit for enabling the first pull-up driving unit and the first pull-down driving unit in response to the enable signal.

19. The input buffer of claim 15, wherein the delay compensation unit further includes a voltage setting unit for setting the node to the constant voltage level in response to an inverted signal of the enable signal if the enable signal is inactivated.

20. An input buffer comprising:
a buffer unit configured to output a first signal having an output delay which is changed according to a change of a cross point of an input signal and another signal; and
a delay compensation unit configured to combine the first signal with a second signal obtained by buffering the input signal with a constant output delay, and outputting a third signal which is compensated for a delay skew of the first signal,
wherein the delay compensation unit drives the third signal in response to the first signal and drives the second signal when an enable signal is activated, and outputs the third signal as a level of a power supply voltage when the enable signal is inactivated.

21. The input buffer of claim 20, wherein the buffer unit buffers the input signal using a voltage difference of two input signals which are out of phase with each other.

22. The input buffer of claim 20, wherein the buffer unit and the delay compensation unit are activated in response to the enable signal.

23. The input buffer of claim 20, wherein the delay compensation unit includes:
   a first inverter configured to invert the first signal;
   a second inverter configured to invert the second signal;
   a first pull-up driving unit configured to pull-up drive a node in response to an output signal of the first inverter;
   a first pull-down driving unit configured to pull-down drive the node in response to an output signal of the second inverter;
   a second pull-up driving unit configured to pull-up drive the node in response to the output signal of the second inverter;
   an enable unit configured to enable the first pull-up driving unit and the first pull-down driving unit in response to the enable signal; and
   a voltage setting unit configured to set the node to a constant voltage level in response to an inverted signal of the enable signal if the enable signal is inactivated.

24. The input buffer of claim 23, wherein each of the first and second inverters includes a plurality of inverters connected in parallel to one another.

25. The input buffer of claim 23, wherein the first pull-up driving unit includes a plurality of PMOS transistors connected in parallel to one another and wherein the first pull-down driving unit includes a plurality of NMOS transistors connected in parallel to one another.

* * * * *